United States Patent
Kim (10) Patent No.: US 7,184,740 B2
(45) Date of Patent: Feb. 27, 2007

(54) DIRECT CONVERSION RECEIVER FOR CALIBRATING PHASE AND GAIN MISMATCH

(75) Inventor: Young-jin Kim, Youngin (KR)

(73) Assignee: Samsung Electronics Co., Ltd. (KR)

( * ) Notice: Subject to any disclaimer, the term of this patent is extended or adjusted under 35 U.S.C. 154(b) by 391 days.

(21) Appl. No.: 10/715,608

(22) Filed: Nov. 18, 2003

(65) Prior Publication Data

US 2004/0137869 A1    Jul. 15, 2004

(30) Foreign Application Priority Data

Jan. 15, 2003    (KR) .................... 10-2003-0002755

(51) Int. Cl.
*H04B 1/26* (2006.01)

(52) U.S. Cl. .................... 455/324; 455/136; 455/139; 455/209; 375/332

(58) Field of Classification Search ............ 455/130, 455/137, 146, 189, 323, 324, 326, 132, 133, 455/136, 138, 139, 205, 209, 314, 315; 375/206, 375/316, 332, 215, 322, 324

See application file for complete search history.

(56) References Cited

U.S. PATENT DOCUMENTS 5,095,536 A * 3/1992 Loper ..................... 455/324
5,179,730 A * 1/1993 Loper ..................... 455/266

(Continued)

FOREIGN PATENT DOCUMENTS

EP    0 841 756 A2    5/1998
EP    0 841 756 A3    11/2001
WO    WO02075917    9/2002

OTHER PUBLICATIONS

Double, Zero, Single, Low IF Receiver architecture, MICROS Research Center, Jul. 3, 2001.
Asad A. Abidi, Direct-Conversation Radio Transceivers for Digital Communications, IEEE Journal of Solid-State Circuits, vol. 30, No. 12, Dec. 1995.
Derek K. Shaeffer, The Design and Implementation of Low-Power CMOS Radio Receivers, A Dissertation Submitted to the Dept. of Electrical Engineering and the Committee on Graduate Studies of Stanford Univeristy, Chapt. 3: Fundamentals of Radio Reception, pp. 48-49, Dec. 1998.

*Primary Examiner*—Edward F. Urban
*Assistant Examiner*—Nhan T. Le
(74) *Attorney, Agent, or Firm*—F. Chau & Associates, LLC (57) ABSTRACT

A direct conversion receiver (DCR) calibrated for phase and gain mismatch is provided. The DCR comprises a poly-phase filter that generates mismatched in-phase and quadrature-phase differential signals; the in-phase differential signal is mixed with first and second local oscillation signals; the quadrature-phase differential signal is mixed with third and fourth local oscillation signals; the first and second local oscillation signals have a first adjustable phase mismatch, and the third and fourth oscillation signals have a second adjustable phase mismatch; A mismatch estimation unit (MEU) estimates the entire phase/gain mismatch (signal distortion) of the DCR, The first and second adjustable phase mismatches are adjusted so that the signal distortion of the DCR, as estimated by the MEU is minimized. Thereafter, reduced-component DCRs (without an MEU), calibrated for the mismatches of a poly-phase filter, may be mass produced.

29 Claims, 6 Drawing Sheets

U.S. PATENT DOCUMENTS

| | | | |
|---|---|---|---|
| 5,249,203 A * | 9/1993 | Loper | 375/344 |
| 5,488,629 A * | 1/1996 | Takahashi et al. | 375/150 |
| 6,289,048 B1 | 9/2001 | Richards et al. | 375/235 |
| 6,590,943 B1 * | 7/2003 | Ali | 375/332 |
| 2001/0028689 A1 | 10/2001 | Kasperkovitz | 375/327 |
| 2002/0155822 A1 | 10/2002 | Adachi | |
| 2004/0038649 A1 * | 2/2004 | Lin et al. | 455/130 |
| 2004/0116096 A1 * | 6/2004 | Shen | 455/323 |

* cited by examiner

DIRECT CONVERSION RECEIVER FOR CALIBRATING PHASE AND GAIN MISMATCH

BACKGROUND OF THE INVENTION

1. Field of the Invention

The present invention relates to a radio frequency (RF) signal receiver, and more particularly, to a direct conversion RF signal receiver.

2. Description of the Related Art

A direct conversion method is a method by which a signal in an RF band is down-converted into a baseband signal by mixing once the RF signal with a local oscillation signal. That is, the RF band signal is directly converted into a baseband signal, not converted into an intermediate frequency (IF) band signal and then into a baseband signal. In general, the former is referred to as a heterodyne method, while the latter is referred to as a direct conversion method.

Figure 7:
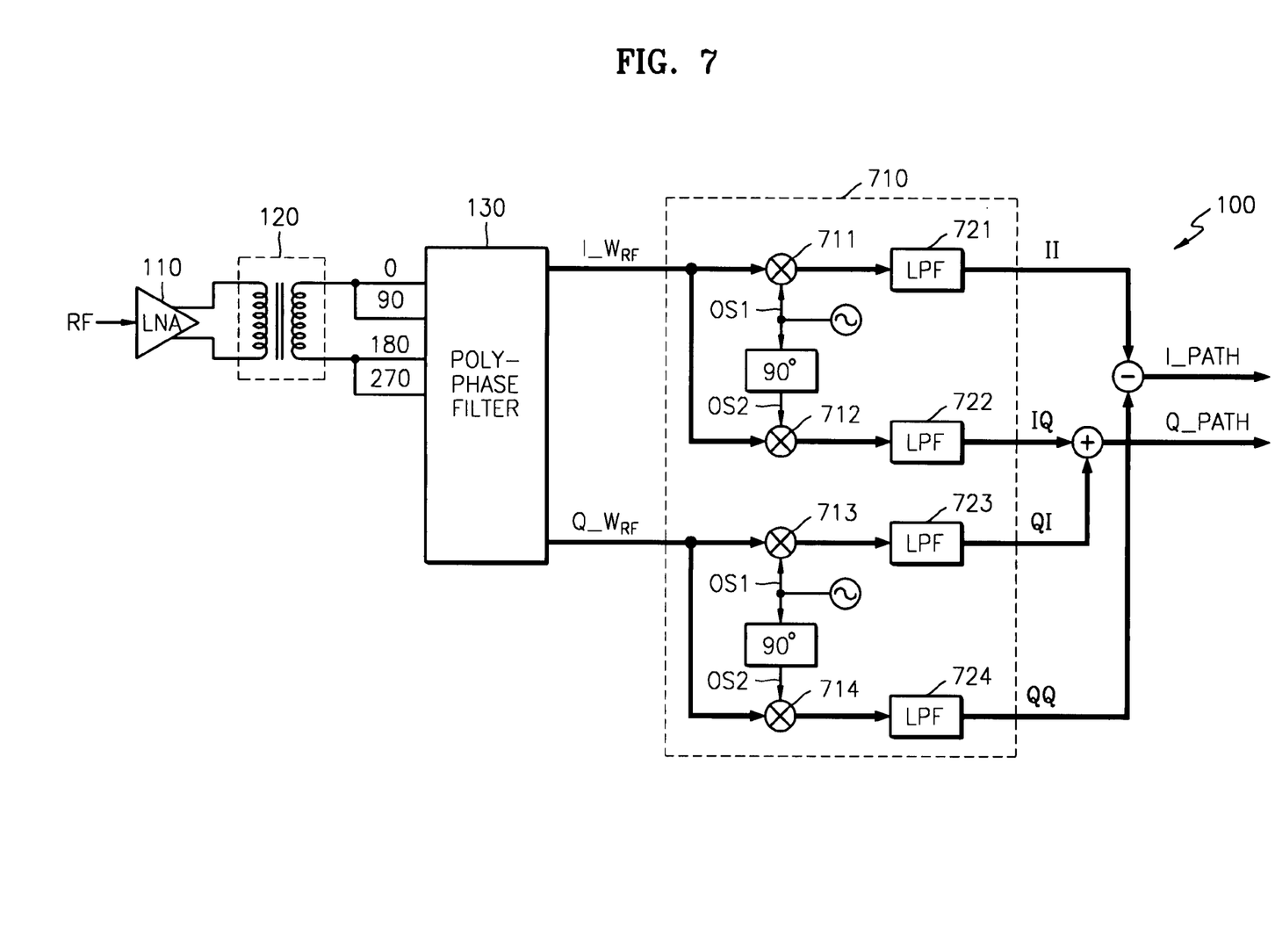
FIG. 7 is a diagram showing a conventional DCR.

FIG. 7 is a diagram of a conventional direct conversion receiver (hereinafter referred to as a DCR). When the conventional DCR receives an RF signal, a low noise amplifier 110 amplifies the RF signal and a transformer 120 converts the amplified RF signal into a differential signal. The differential signal is converted into an in-phase differential signal ($I\_W_{RF}$) and a quadrature-phase differential signal ($Q\_W_{RF}$) through a poly-phase filter 130 and input to a down-conversion mixer unit 710. The mixer unit 710 comprises a first mixer 711 and a second mixer 712 that mix the in-phase differential signal ($I\_W_{RF}$) with a first local oscillation signal (OS1) and a second local oscillation signal (OS2), respectively; a third mixer 713 and a fourth mixer 714 that mix the quadrature-phase differential signal ($Q\_W_{RF}$) with the first and second oscillation signals (OS1, OS2), respectively; and filters 721 through 724 that low pass filter the outputs of the respective mixers 711 through 714. Here, the second local oscillation signal (OS2) has the same oscillation frequency as that of the first local oscillation signal (OS1), but a 90° phase difference from the first local oscillation signal (OS1).

A subtracter subtracts the output signal (QQ) of the fourth mixer 714 from the output signal (II) of the first mixer 711 to output an I-path signal (I_PATH). An adder adds the output signal (IQ) of the second mixer 712 and the output signal (QI) of the third mixer 713 to output a Q-path signal (Q_PATH). The I-path signal (I_PATH) and Q-path signal (Q_PATH) are baseband signals converted from an RF signal.

The DCR having the structure shown in FIG. 7 usually has a phase and gain mismatch. The phase and gain mismatch in the DCR occurs in the poly-phase filter 130 and the mixer unit 710. Ideally the phase difference of the in-phase differential signal ($I\_W_{RF}$) and the quadrature-phase differential signal ($Q\_W_{RF}$) output from the poly-phase filter 130 is 90°, but the actual phase difference is not. Also, ideally, the phase difference of the first and second local oscillation signals (OS1, OS2) provided to the mixers 711 through 714 is 90° and the gains of the output signals of the mixers 711 through 714 are the same. However, the phase difference of the first and second location oscillation signals (OS1, OS2) is actually 90±φ (causing a phase mismatch. Also, a gain mismatch occurs in the output signals of the mixers.

If the phase and gain mismatch occurs in the DCR, as described above, the error rate of the received signal increases due to the mismatch, or the signal fidelity is degraded. Accordingly, to prevent distortion of a signal and to obtain a desired signal, it is important to identify the degree of phase and gain mismatch degree in the DCR and to calibrate for the mismatch.

However, to solve the phase mismatch the conventional methods have focused on a local oscillator, which generates a local oscillation signal. That is, most efforts involve generating a local oscillation signal without a phase mismatch. However, according to conventional methods, implementation of a local oscillator becomes difficult or the cost of implementation increases, resulting in a limitation to removing the mismatch.

SUMMARY OF THE INVENTION

The present invention provides a direct conversion receiver (DCR) that minimizes distortion of a converted radio frequency RF signal, by estimating a phase mismatch and gain mismatch and then calibrating for the mismatch.

According to an aspect of the present invention, there is provided a direct conversion receiver comprising a transformer that converts a radio frequency (RF) signal into a differential signal; a poly-phase filter that receives the differential signal and generates an in-phase differential signal and a quadrature-phase differential signal; an in-phase mixer that mixes the in-phase differential signal with a first local oscillation signal and a second local oscillation signal, respectively, and low pass filters signals that result from mixing; a quadrature-phase mixer that mixes the quadrature-phase differential signal with the first local oscillation signal and a third local oscillation signal, respectively, and low pass filters signals that result from mixing; and a mismatch estimation unit that estimates the phase mismatch of the poly-phase filter and/or a phase mismatch of the in-phase mixer and the quadrature-phase mixer, from output signals of the in-phase mixer unit and the quadrature-phase mixer unit, so that in response to an output signal of the mismatch estimation unit, the distortion resulting from the phase mismatch of the DCR can be minimized.

In the direct conversion receiver, the phase mismatch of the in-phase mixer unit and the quadrature-phase mixer unit can be adjusted in response to the output signal of the mismatch estimation unit to calibrate for mismatch in signals from the poly-phase filter. The in-phase mixer unit comprises a first mixer, which mixes the in-phase differential signal with the first local oscillation signal, and a second mixer, which mixes the in-phase differential signal with the second local oscillation signal; and the quadrature-phase mixer unit comprises a third mixer, which mixes the quadrature-phase differential signal with the first local oscillation signal, and a fourth mixer, which mixes the quadrature-phase differential signal with the third local oscillation signal. The phase difference of the second local oscillation signal and the first local oscillation signal is 90° plus a phase calibration factor, and the phase difference of the third local oscillation signal and the first local oscillation signal is 90° minus the same phase calibration factor. The in-phase mixer can be implemented using a fixed phase shifter, that phase shifts the first local oscillation signal and outputs an output signal plus a first variable phase shifter, which shifts the output signal of the fixed phase shifter by a the phase calibration factor and outputs the result as the second local oscillation signal. Similarly, the quadrature-phase mixer can be implemented using a second variable phase shifter, which shifts the output signal of the fixed phase shifter by the negative of the variable phase calibration factor and outputs the result as the third local oscillation signal.

According to another aspect of the present invention, there is provided a direct conversion receiver comprising a transformer, which converts a radio frequency (RF) signal into a differential signal; a poly-phase filter that receives the differential signal, and generates an in-phase differential signal and a quadrature-phase differential signal; an in-phase mixer, which mixes the in-phase differential signal with a first local oscillation signal and a second local oscillation signal, respectively, and low pass filters the signals; a quadrature-phase mixer, which mixes the quadrature-phase differential signal with the first local oscillation signal and a second oscillation signal, respectively, and low pass filters the signals; and a mismatch estimation unit, that estimates the gain mismatch of the poly-phase filter, and/or the gain mismatch of the in-phase mixer and the quadrature-phase mixer, from the output signals of the in-phase mixer and the quadrature-phase mixer, whereby in response to the output signal of the mismatch estimation unit, the gain mismatch of the DCR can be adjusted to minimize distortion. The gain mismatch of the signals output from the in-phase mixer and the quadrature-phase mixer is adjusted relative to the other in response to the output signal of the mismatch estimation unit.

According to still another aspect of the present invention, there is provided a direct conversion receiver comprising a transformer, that converts an RF signal into a differential signal; a poly-phase filter, that receives the differential signal, and generates an in-phase differential signal and a quadrature-phase differential signal; a differential signal adder which adds the in-phase differential signal and the quadrature-phase differential signal, and generates an added differential signal; a differential signal subtracter which subtracts the quadrature-phase differential signal from the in-phase differential signal, and generates a subtracted differential signal; a mixer unit that mixes the added differential signal with a first local oscillation signal and mixes the subtracted differential signal with a second local oscillation signal; and a mismatch estimation unit that estimates an entire gain mismatch of the DCR, including a gain mismatch of the poly-phase filter and a gain mismatch of the mixer unit, from the output signals of the mixer unit, so that the gain mismatch of the DCR can be minimized in response to an output signal of the mismatch estimation unit. Within the mixer unit, a first mixer that mixes the added differential signal with the first local oscillation signal and a second mixer which mixes the subtracted differential signal with the second local oscillation signal.

According to yet still another aspect of the present invention, there is provided a direct conversion receiver comprising a transformer, that converts an RF signal into a differential signal; a poly-phase filter, that receives the differential signal, and generates an in-phase differential signal and a quadrature-phase differential signal; a differential signal adder, which adds the in-phase differential signal and the quadrature-phase differential signal, and generates an added differential signal; a differential signal subtracter, which subtracts the quadrature-phase differential signal from the in-phase differential signal, and generates a subtracted differential signal; a mixer unit, that mixes the added differential signal with a first local oscillation signal and mixes the subtracted differential signal with a second local oscillation signal; and a mismatch estimation unit, that estimates the gain mismatch of the poly-phase filter or the gain mismatch of the mixer unit from the output signals of the mixer unit, wherein the gain mismatch of the poly-phase filter or the mixer unit is adjusted in response to the output signal of the mismatch estimation unit.

According to yet still another aspect of the present invention, component-reduced calibrated direct conversion receivers (DCRs) that minimize distortion of a converted radio frequency RF signal because they are calibrated for the phase/gain mismatch in the included mass-produced poly-phase filter but which do not contain nor need not contain a mismatch estimation unit can be mass produced for commercial purposes. These calibrated component-reduced DCRs may contain fixed or adjustable phase-shifters and/or fixed or adjustable gain adjusters for initial calibration or recalibration purposes.

A method for producing such component-reduced calibrated direct conversion receivers (DCRs) comprises: providing a poly-phase filter for generating an in-phase differential signal and a quadrature-phase differential signal, having a phase mismatch and/or a gain mismatch; providing a first mixer which mixes the in-phase differential signal with a first local oscillation signal; providing a second mixer which mixes the quadrature-phase differential signal with a second local oscillation signal; and providing at least one of: a phase shifter, that phase shifts the first local oscillation signal by 90° plus the value of a phase calibration factor that calibrates for the phase mismatch of the poly-phase filter, and outputs the result as the second local oscillation signal; and/or a variable gain adjuster for adjusting the gain of the signal output from the first mixer and/or from the second mixer for calibrating for the gain mismatch of the poly-phase filter.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
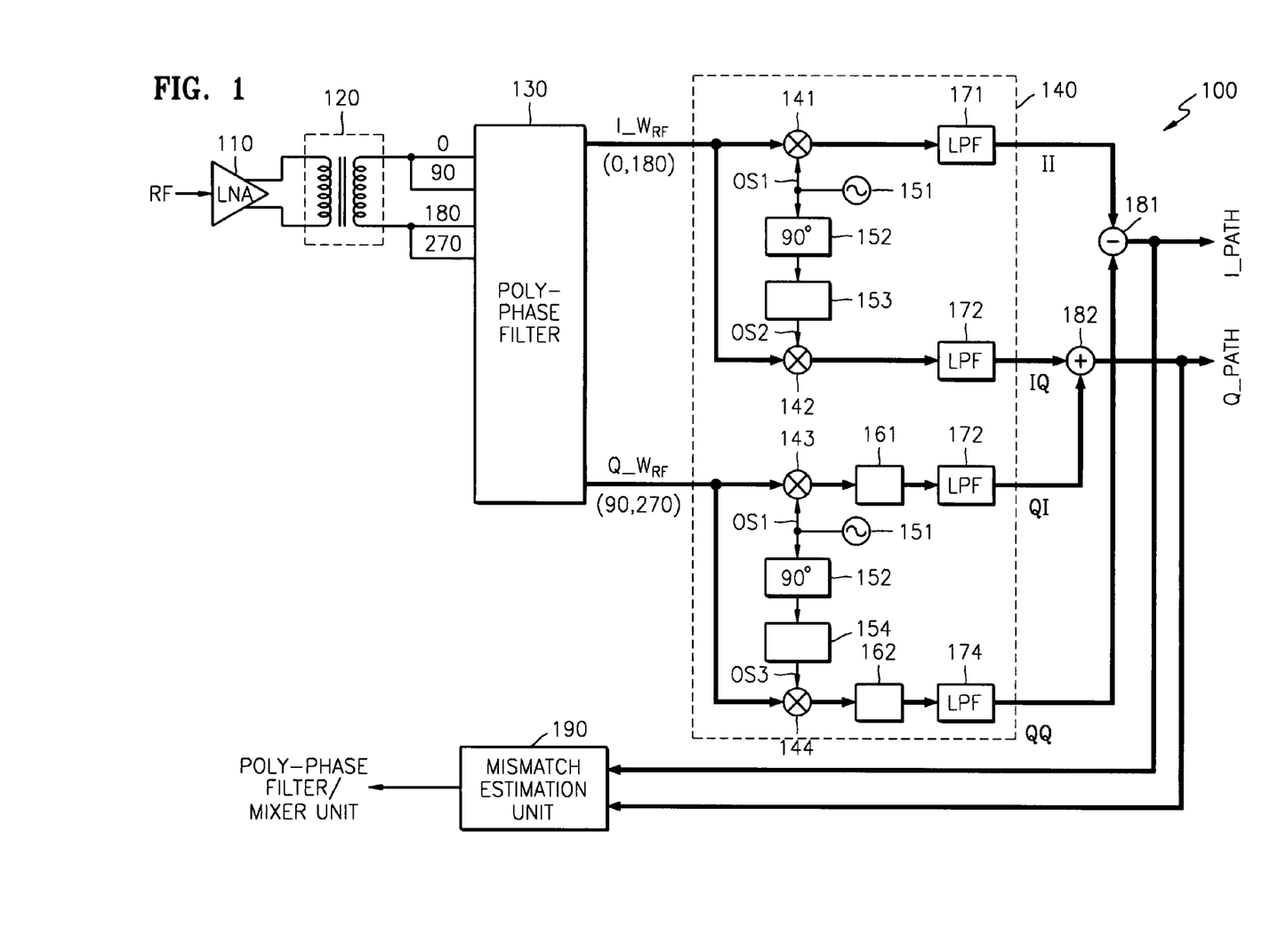
FIG. 1 is a block diagram showing a direct conversion receiver (DCR) according to a preferred embodiment of the present invention.

Referring to FIG. 1, the DCR according to a preferred embodiment of the present invention comprises a low noise amplifier 110, a transformer 120, a poly-phase filter 130, a mixer unit 140, a subtracter 181, an adder 182, and a mismatch estimation unit 190.

The low noise amplifier 110 receives and amplifies an RF signal. The transformer 120 converts the amplified RF signal into differential signals of 0° and 180°.

The poly-phase filter 130 receives the differential signals of 0° and 180° as inputs and outputs signals having phases of 0°, 90°, 180°, and 270°. The signals of 0° and 180°, respectively, are input into the 90° and 270° inputs of the poly-phase filter 130. The poly-phase filter 130 receives differential signals of 0° and 180° and outputs an in-phase (0° and 180°) differential signal (I_$W_{RF}$), and a quadrature-phase (90° and 270°) differential signal (Q_$W_{RF}$).

The mixer unit 140 comprises in-phase first and second mixers 141 and 142, quadrature-phase third and fourth mixers 143 and 144, a local oscillator 151, a 90° phase shifter 152, variable phase shifters 153 and 154, variable gain adjusters 161 and 162, and low pass filters 171 through 174. In the present embodiment, for convenience of explanation, it is assumed that the local oscillator 151, the 90° phase shifter 152, variable phase shifters 153 and 154, variable gain adjusters 161 and 162, and low pass filters 171 through 174 are included in the mixer unit 140.

The first and second in-phase mixers 141 and 142 receive the in-phase differential signal (I_$W_{RF}$) output from the poly-phase filter 130, and mix with a first local oscillation signal (OS1) and a second local oscillation signal (OS2), respectively.

The first and second local oscillation signals (OS1, OS2) are oscillation signal having a predetermined oscillation frequency ($W_{LO}$). If no phase mismatch exists in the poly-phase filter 130, it is preferable that the first and second oscillation signals (OS1, OS2) have a 90° phase difference. However, since a phase mismatch ($\phi_{\epsilon 1}$) occurs in the poly-phase filter 130, the phase difference of the first and second local oscillation signals (OS1, OS2) is set to 90+$\phi_{\epsilon 2}$ in the present embodiment to calibrate for the phase mismatch ($\phi_{\epsilon 1}$) in the poly-phase filter 130. Here, $\phi_{\epsilon 2}$ is a variable value.

The local oscillator 151 generates the first local oscillation signal (OS1) having the oscillation frequency ($W_{LO}$). The second local oscillation signal (OS2) has a phase difference of 90+$\phi_{\epsilon 2}$° from the first local oscillation signal (OS1). To generate the second local oscillation signal (OS2) as described above, the first local oscillation signal (OS1) is phase shifted by 90° by the 90° phase shifter 152 and then phase shifted again by $\phi_{\epsilon 2}$° by the variable phase shifter 153. Here, $\phi_{\epsilon 2}$ is varied according to the output of the mismatch estimation unit 190.

Accordingly, the first mixer 141 mixes the in-phase differential signal (I_$W_{RF}$) with the first local oscillation signal (OS1) and the second mixer 142 mixes the in-phase differential signal (I_$W_{RF}$) with the second local oscillation signal (OS2).

The third and fourth quadrature-phase mixers 143 and 144 receive the quadrature-phase differential signal (Q_$W_{RF}$) output from the poly-phase filter 130, and mix with the first local oscillation signal (OS1) and the third local oscillation signal (OS3), respectively. More specifically, the third mixer 143 mixes the quadrature-phase differential signal (Q_$W_{RF}$) with the first local oscillation signal (OS1) and the fourth mixer 144 mixes the quadrature-phase differential signal (Q_$W_{RF}$) with the third local oscillation signal (OS3). Here, the third local oscillation signal (OS3) has a phase difference of 90−$\phi_{\epsilon 2}$° from the first local oscillation signal (OS1). To generate the third local oscillation signal (OS3) as described above, the first local oscillation signal (OS1) is phase shifted by 90° by the 90° phase shifter 152 and then phase shifted again by $\phi_{\epsilon 2}$° by the variable phase shifter 154.

As will be explained later, $\phi_{\epsilon 2}$ is used to calibrate for the phase mismatch ($\phi_{\epsilon 1}$) from the poly-phase filter 130, and the value $\phi_{\epsilon 2}$ is varied in response to the result of phase mismatch estimation by the mismatch estimation unit 190.

The output signals of the first and second mixers 141 and 142 are sent through the first and second low pass filters 171 and 172, respectively, to remove high frequency noise. The output signals of the third and fourth mixers 143 and 144 are sent through the variable gain adjusters 161 and 162, respectively, and then, to remove any high frequency noise, are sent through the third and fourth low pass filters 173 and 174. The variable gain adjusters 161 and 162 are used to calibrate for the gain mismatch from the poly-phase filter 130. The gain is adjusted in response to the output of the mismatch estimation unit 190. This will be explained later in detail.

The subtracter 181 subtracts the output signal of the fourth low pass filter 174 from the output signal of the first low pass filter 171, and outputs an I-path signal (I_PATH). The adder 182 adds the output signal of the second low pass filter 172 and the output signal of the third low pass filter 173, and outputs a Q-path signal (Q_PATH). The I-path signal (I_PATH) and Q-path signal (Q_PATH) are baseband signals converted from the RF signal.

The mismatch estimation unit 190 receives the I-path signal (I_PATH) and Q-path signal (Q_PATH), and estimates a phase mismatch and gain mismatch.

Figure 2:
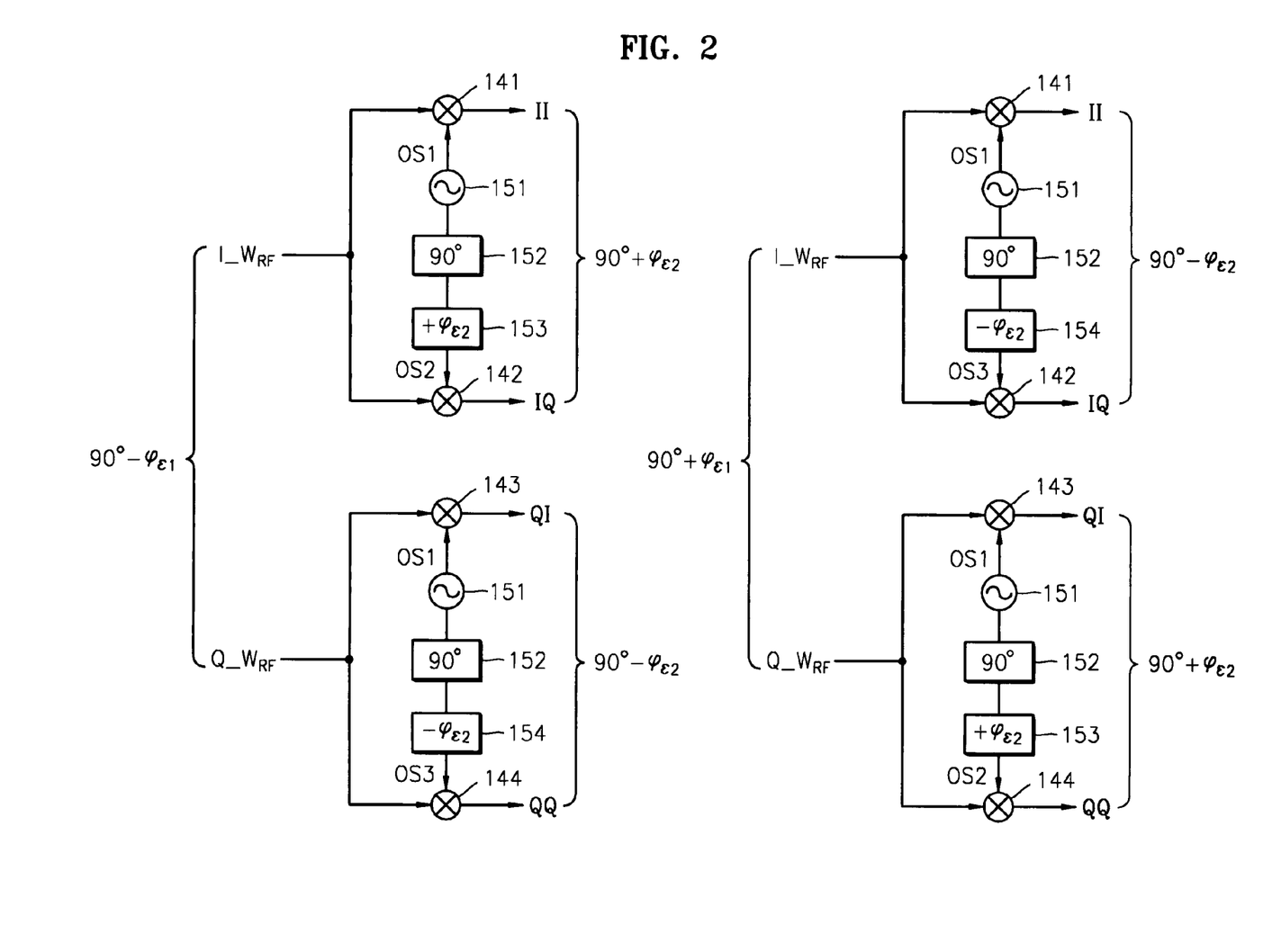
FIG. 2 is a diagram for explaining a process of estimating and calibrating for a phase mismatch in a DCR according to a preferred embodiment of the present invention shown in FIG. 1.

FIG. 2 is a diagram for explaining a process of estimating and calibrating for a phase mismatch in a DCR according to a preferred embodiment of the present invention shown in FIG. 1.

First, it is assumed that due to a phase mismatch ($\phi_{\epsilon 1}$) in the poly-phase filter 130 a phase difference of ($\phi_{\epsilon 1}$) occurs between differential signals (I_$W_{RF}$, Q_$W_{RF}$) output from the poly-phase filter 130 occurs. Of course the phase mismatch ($\phi_{\epsilon 1}$) of the poly-phase filter 130 cannot be identified before estimation by the mismatch estimation unit 190. To minimize the entire phase mismatch of the DCR and calibrate for the phase mismatch ($\phi_{\epsilon 1}$) of the poly-phase filter 130, the phase mismatch (±$\phi_{\epsilon 2}$) of the mixer unit 140 is adjusted. In other words, though the degree of the phase mismatch ($\phi_{\epsilon 1}$) occurring in the poly-phase filter 130 cannot be identified, the present invention provides a method and apparatus for minimizing the entire phase mismatch of the DCR by estimating and calibrating for the phase mismatch ($\phi_{\epsilon 1}$) of the poly-phase filter 130.

For this purpose, the phase difference of the local oscillation signal (OS1) provided to the first mixer 141 and the local oscillation signal (OS2) provided to the second mixer 142 is set to 90+$\phi_{\epsilon 2}$, where $\phi_{\epsilon 2}$ varies according to the output of the mismatch estimation unit 190. Also, the phase difference of the local oscillation signal (OS1) provided to the third mixer 143 and the local oscillation signal (OS3) provided to the fourth mixer 144 is set to 90−$\phi_{\epsilon 2}$.

Alternatively, the phase difference of the local oscillation signal (OS1) provided to the first mixer 141 and the local oscillation signal (OS2) provided to the second mixer 142 is set to 90−$\phi_{\epsilon 2}$ and the phase difference of the local oscillation signal (OS1) provided to the third mixer 143 and the local oscillation signal (OS3) provided to the fourth mixer 144 is set to 90+$\phi_{\epsilon 2}$. That is, the phase mismatch of the first mixer 141 and the second mixer 142 and the phase mismatch of the third mixer 143 and the fourth mixer 144 have the same value but with opposite signs.

When the output of the mismatch estimation unit 190 is minimized, the phase mismatch ($\phi_{\epsilon 2}$) between mixers (between 141 and 142, and between 143 and 144) is a value for calibrating for the phase mismatch ($\phi_{\epsilon 1}$) of the poly-phase filter 130. Varying the phase mismatch ($\phi_{\epsilon 2}$) (also called the "phase calibration factor ($\phi_{\epsilon 2}$)" between mixers (between 141 and 142, and between 143 and 144) enables the search for a value at which the output of the mismatch estimation unit 190 is minimized (i.e., calibrated for phase mismatch ($\phi_{\epsilon 1}$)).

In the present embodiment of the invention, by adjusting the phase calibration factor ($\phi_{\epsilon 2}$) in the mixer unit 140 with respect to the estimation result of the mismatch estimation unit 190, the entire phase mismatch of the DCR is minimized or removed. Thus, by regarding the phase mismatch ($\phi_{\epsilon 1}$) occurring in the poly-phase filter 130 as a fixed value, and by varying the phase calibration factor ($\phi_{\epsilon 2}$) in the mixer unit 140, a value of $\phi_{\epsilon 2}$ is estimated at which the entire mismatch of the DCR is minimized.

Alternatively, in other embodiments of the present invention, it is also possible to fix the phase mismatch ($\phi_{\epsilon 2}$) occurring in the mixer unit 140 and vary the phase mismatch ($\phi_{\epsilon 1}$) occurring in the poly-phase filter 130 such that the entire phase mismatch of the DCR can be minimized.

Figure 3:
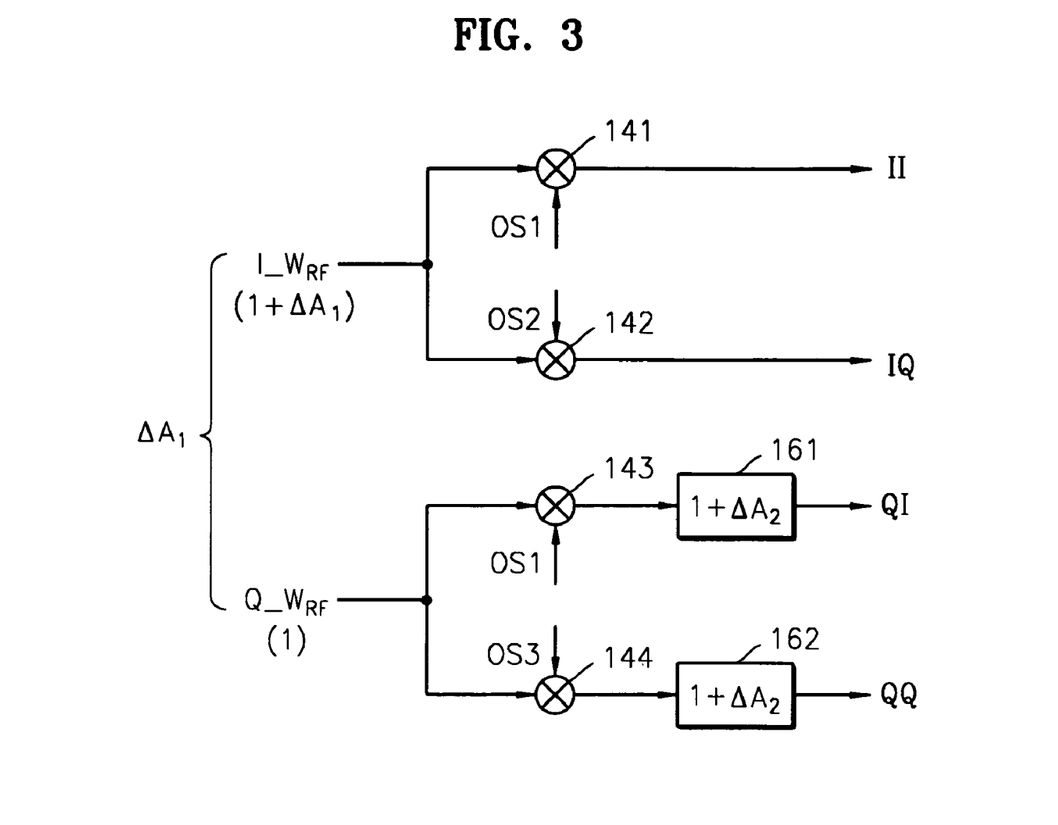
FIG. 3 is a diagram for explaining a process of estimating and calibrating for a gain mismatch in a DCR according to a preferred embodiment of the present invention shown in FIG. 1.

FIG. 3 is a diagram for explaining a process of estimating and calibrating for a gain mismatch in a DCR according to a preferred embodiment of the present invention shown in FIG. 1.

It is assumed that due to a gain mismatch ($\Delta A_1$) in the poly-phase filter 130 a gain difference of $\Delta A_1$ occurs between differential signals (I_W$_{RF}$, Q_W$_{RF}$) output from the poly-phase filter 130 occurs. Here, it is assumed that the gain of the in-phase differential signal (I_W$_{RF}$) is greater than the gain of the quadrature-phase differential signal (Q_W$_{RF}$) by $\Delta A_1$. Of course the gain mismatch ($\Delta A_1$) of the poly-phase filter 130 cannot be identified before estimation by the mismatch estimation unit 190.

Varying the gain mismatch ($\Delta A_2$) (also called the gain calibration factor ($\Delta A_2$)) of the mixer unit 140 enables the discovery of a value of the gain calibration factor ($\Delta A_2$) of the mixer unit 140 at which the output of the mismatch estimation unit 190 is minimized. By doing so, the gain mismatch ($\Delta A_1$) of the poly-phase filter 130 is also estimated. In other words, though the degree of the gain mismatch ($\Delta A_1$) occurring in the poly-phase filter 130 cannot be identified, the present invention provides a method and apparatus for minimizing the entire gain mismatch of the DCR by estimating and calibrating for the gain mismatch ($\Delta A_1$) of the poly-phase filter 130.

For this purpose, variable gain adjusters 161 and 162 are disposed at the output ends of the third and fourth mixers 143 and 144, so that the gains of the output signals of the third and fourth mixers 143 and 144 are greater than the gains of the first and second mixers 141 and 142 by $\Delta A_2$. The variable gain adjusters 161 and 162 can be implemented with a variable amplifier and/or a variable attenuator. Though the variable gain adjusters 161 and 162 are disposed at the output ends of the third and fourth mixers 143 and 144 in the present embodiment, in alternative embodiment of the invention they could instead be disposed at the input ends of the third and fourth mixers 143 and 144 (with or without merger), or at the input ends or output ends of the first and second mixers 141 and 142. Thus, the variable gain adjuster or adjusters 161 and 162 will be disposed on the path of the in-phase differential signal (I_W$_{RF}$) and/or the path of the quadrature-phase differential signal (Q_W$_{RF}$) so that the gain mismatch between the path of the in-phase differential signal (I_W$_{RF}$) and the path of the quadrature-phase differential signal (Q_W$_{RF}$) is $\Delta A_2$. The "path of the in-phase differential signal (I_W$_{RF}$)" indicates a path from the output end of the poly-phase filter 130 through the first and second mixers 141 and 142 to the adder 182 and the subtracter 181, while the "path of the quadrature-phase differential signal (Q_W$_{RF}$)" indicates a path from the output end of the poly-phase filter 130 through the third and fourth mixers 143 and 144 to the adder 182 and the subtracter 181.

Accordingly, varying the gain mismatch in the mixer unit 140, that is, varying the gain calibration factor $\Delta A_2$ between the path of the in-phase differential signal (I_W$_{RF}$) and the path of the quadrature-phase differential signal (Q_W$_{RF}$) enables the search for a value of $\Delta A_2$ at which the output of the mismatch estimation unit 190 is minimized. When the output of the mismatch estimation unit 190 is minimized, the gain mismatch ($\Delta A_2$) of the mixer unit 140 is a value for calibrating for the gain mismatch $\Delta A_1$ of the poly-phase filter 130.

In the present embodiment of the invention, by adjusting the gain mismatch ($\Delta A_2$) in the mixer unit 140, with respect to the estimation result of the mismatch estimation unit 190, the entire gain mismatch of the DCR is minimized or removed. Thus, by regarding the gain mismatch $\Delta A_1$ occurring in the poly-phase filter 130 as a fixed value, and by varying the gain mismatch ($\Delta A_2$) of the mixer unit 140, a value of gain calibration factor ($\Delta A_2$) is estimated at which the entire gain mismatch of the DCR is minimized.

Alternatively, in other embodiments of the invention, it is also possible to fix the gain mismatch ($\Delta A_2$) occurring in the mixer unit 140 and vary the gain mismatch ($\Delta A_1$) of the poly-phase filter 130 such that the entire gain mismatch of the DCR can be minimized.

In order to explain the principle by which the entire gain mismatch and phase mismatch of the DCR are minimized through the method described above, it is assumed that a cosine signal having a predetermined frequency (WRF) is input as an RF receiving signal to the DCR, according to the exemplary embodiment of the invention shown in FIG. 1. Then, signals (II, IQ, QI, QQ) output from the first through fourth low pass filters 171 through 174 can be expressed by the following equation 1:

$$II(t)=(1+\Delta A_1)\cos(\Delta wt)/4$$

$$IQ(t)=(1+\Delta A_1)\sin(\Delta wt+\phi_{\epsilon 2})/4$$

$$QI(t)=(1+\Delta A_2)\sin(\Delta wt+\phi_{\epsilon 1})/4$$

$$QQ(t)=(1+\Delta A_2)\cos(\Delta wt+\phi_{\epsilon 1}-\phi_{\epsilon 2})/4 \quad (1)$$

As described above, $\Delta A_1$ indicates the gain mismatch in the poly-phase filter 130 and $\phi_{\epsilon 1}$ indicates the phase mismatch in the poly-phase filter 130. $\Delta A_2$ indicates the gain mismatch in the mixer unit 140 and is used for calibrating for the gain mismatch ($\Delta A_1$) in the poly-phase filter 130. $\phi_{\epsilon 2}$ indicates the phase mismatch in the mixer unit 140 and is used for calibrating for the phase mismatch ($\phi_{\epsilon 1}$) in the poly-phase filter 130.

Since the I-path signal (I_PATH) can be obtained by subtracting the output signal (QQ) of the fourth low pass filter 174 from the output signal (II) of the first low pass filter 171, the I-path signal (I_PATH) can be expressed as the following equation 2:

$$\begin{aligned}(II-QQ)(t) &= \frac{1}{4}[(1+\Delta A_1)\cos(\Delta wt) - \\ &\quad (1+\Delta A_2)\cos(\Delta wt+\varphi_{\epsilon 1}-\varphi_{\epsilon 2})] \\ &= \frac{1}{4}[(1+\Delta A_1)-(1+\Delta A_2)\cos(\varphi_{\epsilon 1}-\varphi_{\epsilon 2})]\cos(\Delta wt) \\ &= \frac{1}{4}[(1+\Delta A_2)\sin(\varphi_{\epsilon 1}-\varphi_{\epsilon 2})]\sin(\Delta wt)\end{aligned} \quad (2)$$

Since the Q-path signal (Q_PATH) can be obtained by adding the output signal (IQ) of the second low pass filter 172 and the output signal (QI) of the third low pass filter 173, the Q-path signal (Q_PATH) can be expressed as the following equation 3:

$$(IQ - QI)(t) = \frac{1}{4}[(1+\Delta A_1)\sin(\Delta wt + \varphi_{\varepsilon 2}) - \\ (1+\Delta A_2)\sin(\Delta wt + \varphi_{\varepsilon 1})] \\ = \frac{1}{4}[(1+\Delta A_1)\cos(\varphi_{\varepsilon 2}) - \\ (1+\Delta A_2)\cos(\varphi_{\varepsilon 1})]\sin(\Delta wt) \\ = \frac{1}{4}[(1+\Delta A_1)\sin(\varphi_{\varepsilon 2}) - \\ (1+\Delta A_2)\cos(\varphi_{\varepsilon 1})]\cos(\Delta wt) \quad (3)$$

The mismatch estimation unit 190 squares the I-path signal (II−QQ) and the Q-path signal (IQ+QI), respectively, and adds the two squared signals.

Figure 4:
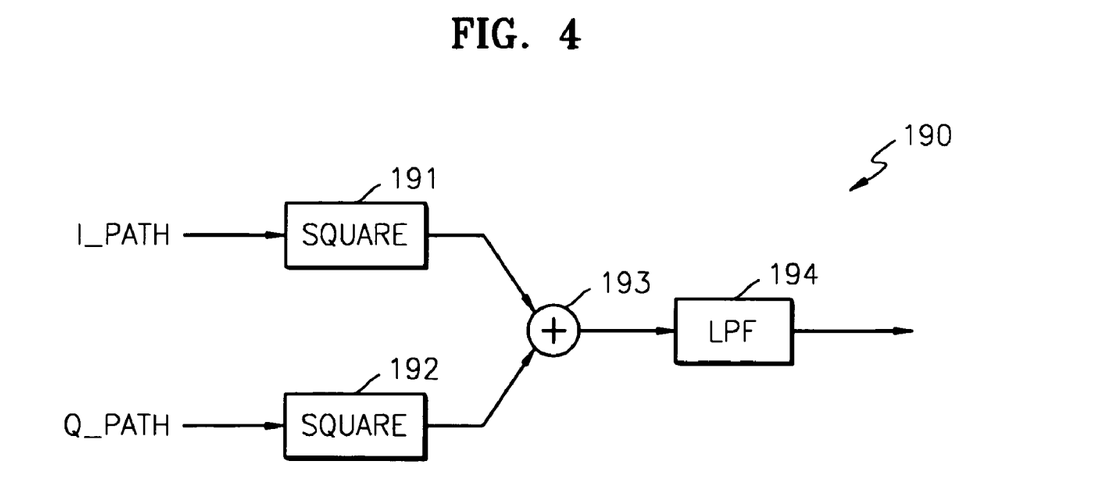
FIG. 4 is a detailed diagram of a mismatch estimation unit shown in FIG. 1.

FIG. 4 is a detailed diagram of the mismatch estimation unit 190 shown in FIG. 1. Referring to FIG. 4, the mismatch estimation unit 190 comprises square units 191 and 192 for squaring the I-path signal (II−QQ) and the Q-path signal (IQ+QI) respectively, an adder 193, and a low pass filter 194. The mismatch estimation unit 190 squares the I-path signal (II−QQ) and the Q-path signal (IQ+QI) respectively, adds the two squared signals, low pass filters the added signal, and outputs the result as an estimated mismatch value. The output of the mismatch estimation unit is fed back to the poly-phase filter 130 or the mixer unit 140 so that the phase/gain mismatch in the poly-phase filter 130 or the mixer unit 140 can be adjusted.

In the following expression 4, $$\Delta A_1, \Delta A_2, (\Delta A_{1-\Delta A2}) \ll 1, \sin(\phi_{\varepsilon 1}-\phi_{\varepsilon 2}) \cong \phi_{\varepsilon 1}-\phi_{\varepsilon 2}, \cos(\phi_{\varepsilon 1}-\phi_{\varepsilon 2}) \cong 1 \quad (4)$$

it is assumed that the gain mismatch ($\Delta A_1$) of the poly-phase filter 130, the gain mismatch ($\Delta A_2$) of the mixer unit 140, the difference ($\Delta A_1-\Delta A_2$) of the two gains, and the difference ($\phi_{\varepsilon 1}-\phi_{\varepsilon 2}$) of the phase mismatch of the poly-phase filter 130 and the phase mismatch of the mixer unit 140 are much less than 1. If the conditions of expression 4 are applied to equations 2 and 3, equations 2 and 3 are expressed simply as the following equation 5:

$$(II-QQ)(t) \cong \frac{1}{4}[(\Delta A_1-\Delta A_2)\cos(\Delta wt) + (\varphi_{\varepsilon 1}-\varphi_{\varepsilon 2})\sin(\Delta wt)] \\ (IQ+QI)(t) \cong \frac{1}{4}[(\Delta A_1-\Delta A_2)\sin(\Delta wt) - (\varphi_{\varepsilon 1}-\varphi_{\varepsilon 2})\cos(\Delta wt)] \quad (5)$$

If equation 5 is used, the value obtained by squaring the I-path signal and the Q-path signal, respectively, is expressed as the following equation 6:

$$(II-QQ)^2 + (IQ+QI)^2 = \frac{1}{16}[(\Delta A_1-\Delta A_2)^2 + (\varphi_{\varepsilon 1}-\varphi_{\varepsilon 2})^2] \quad (6)$$

Equation 6 shows that there is only one pair of estimated variables (i.e., correction factors) that can minimize the value obtained by squaring the I-path signal and the Q-path signal, respectively, and adding the results. Each of the variables can be obtained independently of each other. Thus, in equation 6, when each of the squared terms is minimized, the entire value is minimized. Also, since the gain variable and the phase variable are independent of each other, each variable can be obtained by fixing one squared term and varying the other squared term. Accordingly, the amount of computation decreases greatly.

Figure 5:
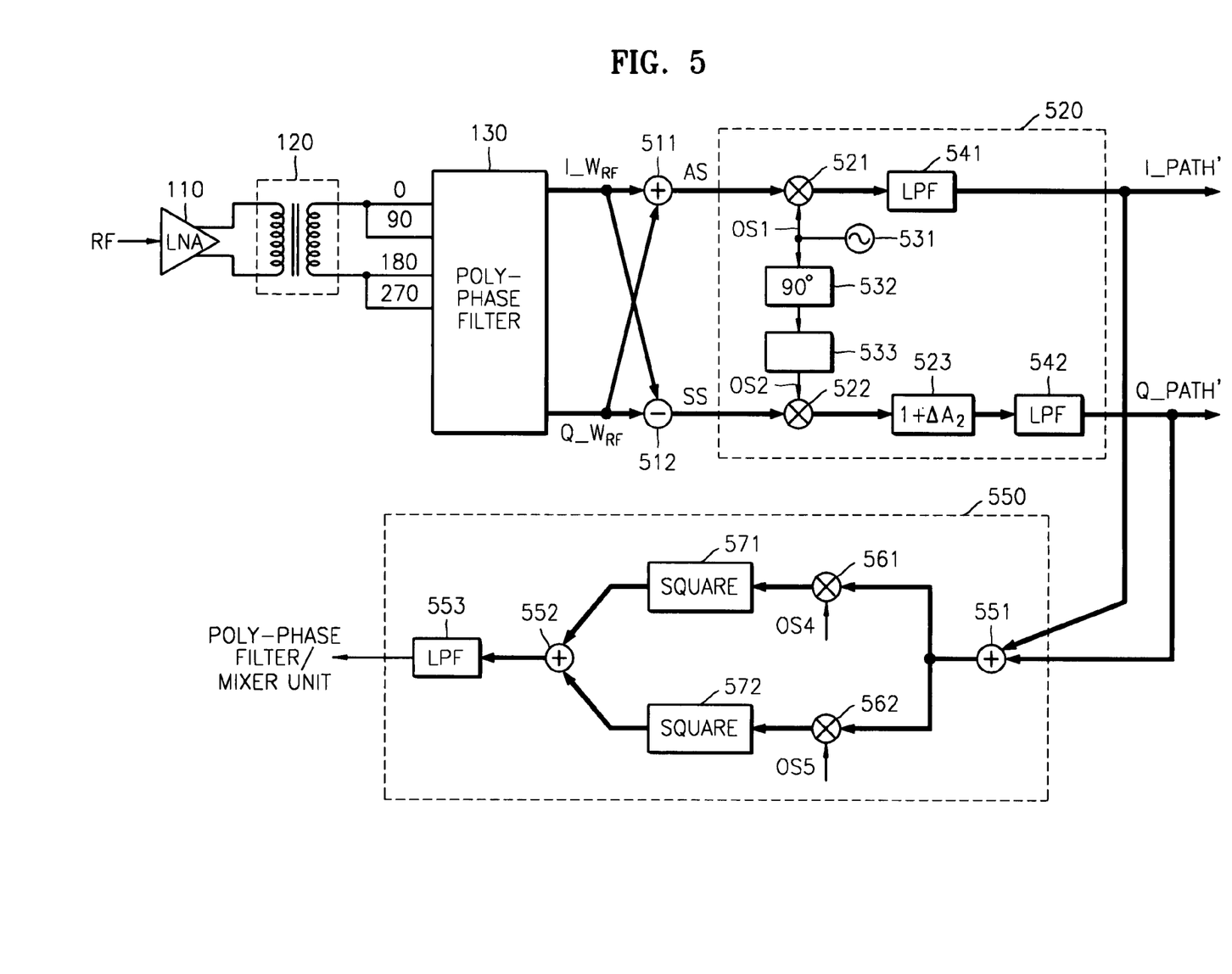
FIG. 5 is a block diagram of the structure of a DCR, according to another preferred embodiment of the present invention, when a phase and gain mismatch is estimated.

FIG. 5 is a block diagram of a DCR according to another preferred embodiment of the present invention. The DCR shown in FIG. 5 has a structure for estimating and compensating for the phase and gain mismatch, that is, a structure for calibrating for the phase and gain mismatch.

Referring to FIG. 5, the DCR according to the embodiment of the present invention comprises a low noise amplifier 110, a transformer 120, a poly-phase filter 130, an adder 511, a subtracter 512, a mixer unit 520, and a mismatch estimation unit 550.

Since the functionality of the low noise amplifier 110, the transformer 120, and the poly-phase filter 130 are the same as explained in reference to FIG. 1, a detailed explanation will be omitted here.

The adder 511 adds the in-phase differential signal (I_$W_{RF}$) and the quadrature-phase differential signal (Q_$W_{RF}$) output from the poly-phase filter 130 and outputs the result (AS). The subtracter 512 subtracts the quadrature-phase differential signal (Q_$W_{RF}$) from the in-phase differential signal (I_$W_{RF}$) and outputs the result (SS).

The mixer unit 520 comprises a first mixer 521, a second mixer 522, a local oscillator 531, a 90° phase shifter 532, a variable phase shifter 533, a variable gain adjuster 523, and low pass filters 541 and 542. For convenience of explanation, in the present embodiment, it is assumed that the local oscillator 531, the 90° phase shifter 532, the variable phase shifter 533, the variable gain adjuster 523, and low pass filters 541 and 542 are included in the mixer unit 520.

The first mixer 521 receives a signal (AS), obtained by adding the in-phase differential signal (I_$W_{RF}$) and the quadrature-phase differential signal (Q_$W_{RF}$), and mixes this signal (AS) with a first local oscillation signal (OS1). The second mixer 522 receives a signal (SS), obtained by subtracting the quadrature-phase differential signal (Q_$W_{RF}$) from the in-phase differential signal (I_$W_{RF}$), and mixes this signal (SS) with a second local oscillation signal (OS2).

The first and second local oscillation signals (OS1, OS2) have a predetermined oscillation frequency ($W_{LO}$). The local oscillator 531 generates the first local oscillation signal (OS1) having the oscillation frequency ($W_{LO}$). The second local oscillation signal (OS2) has a phase difference of 90+$\phi_{\varepsilon 2}$° from the first local oscillation signal (OS1). In order to generate the second local oscillation signal (OS2) as described above, the first local oscillation signal (OS1) is phase shifted by 90° by the 90° phase shifter 532 and then phase shifted again by $\phi_{\varepsilon 2}$° by the variable phase shifter 533. $\phi_{\varepsilon 2}$ is used to calibrate for the phase mismatch ($\phi_{\varepsilon 1}$) in the poly-phase filter 130, and the value $\phi_{\varepsilon 2}$ varies in response to the output of the mismatch estimation unit 190.

To remove high frequency band noise, the output signal of the first mixer 521 is sent through the first low pass filter 541. The output signal of the second mixer 522 is sent through the variable gain adjuster 523, and then to remove high frequency band noise, is sent through the second low pass filter 542. The variable gain adjuster 523 is used to calibrate for the gain mismatch in the poly-phase filter 130 and adjusts the gain in response to the output of the mismatch estimation unit 550.

The mismatch estimation unit 550 receives the output signals (I_PATH', Q_PATH') of the first and second low pass filters 541 and 542 and estimates the phase mismatch and gain mismatch.

The mismatch estimation unit 550 comprises adders 551 and 552, third and fourth mixers 561 and 562, square units 571 and 572, and a low pass filter 553. The adder 551 adds the output signals (I_PATH', Q_PATH') of the first and second low pass filters 541 and 542.

The third and fourth mixers 561 and 562 mix the output signal of the adder 551 with predetermined local oscillation signals (OS4, OS5), respectively. Here, the local oscillation signal (OS4) input to the third mixer 561 and the local oscillation signal (OS5) input to the fourth mixer 562 have an identical oscillation frequency and a 90° phase difference. The third and fourth mixers 561 and 562 induce a 90° phase difference in the paths of the output signal of the adder 551. Accordingly, instead of the third and fourth mixers 561 and 562, a phase shifter can be used in the path from mixer 551 to one of square units 571 and 572. In such alternative embodiments of the invention, the output signal of the adder 551 is directly input to one square unit 571, and also is phase shifted by 90° and then input to the other square unit 572.

The square units 571 and 572 square each of pair of phase-shifted signals derived from adder 551 (e.g., square the output signals of the third mixer 561 and the fourth mixer 562, respectively). The adder 552 adds the output signals of the square units 571 and 572. The output signal of the adder 552 is sent through the low pass filter 553 and output as an estimated mismatch value. The estimated mismatch value is fed back to the poly-phase filter 130 or the mixer unit 520 so that the phase/gain mismatch in the poly-phase filter 130 or the mixer unit 520 can be adjusted or calibrated for in the mixer unit 520.

By constructing the DCR as shown in FIG. 5, the output of the mismatch estimation unit 550 is the same as in equation 6 (above). Accordingly, the process for estimating gain and phase calibration factors that minimize the output of the mismatch estimation unit 550 is similar to the process employed in the first embodiment of the present invention (shown in FIG. 1).

The process for estimating and calibrating for the phase mismatch in a DCR, according to another embodiment of the present invention shown in FIG. 5, will now be explained.

It is assumed that, due to a phase mismatch ($\phi_{e1}$) in the poly-phase filter 130, a phase difference of $\phi_{e1}$ between differential signals (I_$W_{RF}$, Q_$W_{RF}$) output from the poly-phase filter 130 occurs. The phase mismatch ($\phi_{e1}$) of the poly-phase filter 130 is a fixed value. To calibrate for this, and in order to minimize the entire phase mismatch of the DCR, the phase calibration factor ($\phi_{e2}$) of the mixer unit 520 is adjusted.

For this purpose, the phase difference of the local oscillation signal (OS1) provided to the first mixer 521 and the local oscillation signal (OS2) provided to the second mixer 522 is set to 90+$\phi_{e2}$, and $\phi_{e2}$ varies according to the result of the mismatch estimation unit 550.

Varying the phase mismatch ($\phi_{e2}$) between mixers 521 and 522 enables the search for a value at which the output of the mismatch estimation unit 550 is minimized. When the output of the mismatch estimation unit 550 is minimized the phase mismatch ($\phi_{e2}$) between mixers 521 and 522 is a value for calibrating for the phase mismatch ($\phi_{e1}$) of the poly-phase filter 130.

Also in the embodiment of the present invention, by adjusting the phase calibration factor ($\phi_{e2}$) in the mixer unit 520 with respect to the estimation result of the mismatch estimation unit 550, the entire phase mismatch of the DCR is minimized or removed. Thus, by regarding the phase mismatch ($\phi_{e1}$) occurring in the poly-phase filter 130 as a fixed value, and by varying the phase calibration factor ($\phi_{e2}$) in the mixer unit 520, a value is estimated at which the entire mismatch of the DCR is minimized.

Alternatively, in other embodiments of the invention, it is also possible to fix the phase mismatch ($\phi_{e2}$) occurring in the mixer unit 520 and vary the phase mismatch ($\phi_{e1}$) occurring in the poly-phase filter 130 such that the entire phase mismatch of the DCR can be minimized.

The process for estimating and calibrating for the gain mismatch in the DCR according to the embodiment of the present invention shown in FIG. 5, will now be explained.

It is assumed that, due to a gain mismatch $\Delta A_1$ in the poly-phase filter 130, a gain difference of $\Delta A_1$ between differential signals (I_$W_{RF}$, Q_$W_{RF}$) output from the poly-phase filter 130 occurs. Here, it is assumed that the gain of the in-phase differential signal (I_$W_{RF}$) is greater than the gain of the quadrature-phase differential signal (Q_$W_{RF}$) by $\Delta A_1$. Of course the gain mismatch ($\Delta A_1$) of the poly-phase filter 130 cannot be identified before estimation by the mismatch estimation unit 550.

By varying the gain calibration factor ($\Delta A_2$) of the mixer unit 520, a value of the gain mismatch ($\Delta A_2$) of the mixer unit 520 is found at which the output of the mismatch estimation unit 550 is minimized and by doing so, an estimate is achieved for calibrating for the gain mismatch ($\Delta A_1$) of the poly-phase filter 130.

The variable gain adjuster 523 is disposed at the output end of the second mixer 522 so that the gain of the output signal of the second mixer 522 is greater than the gain of the output signal of the first mixer 521 by $\Delta A_2$. The variable gain adjuster 523 can be implemented with a variable amplifier and/or a variable attenuator. Though the variable gain adjuster 523 is disposed at the output end of the second mixer 522 in the present embodiment, it can also be disposed at other places as explained in the description of the first exemplary embodiment of the present invention.

Accordingly, by varying the gain calibration factor $\Delta A_2$ in the mixer unit 520 enables the search for a value at which the output of the mismatch estimation unit 550 is minimized. The value of the gain calibration factor ($\Delta A_2$) of the mixer unit 520 when the output of the mismatch estimation unit 550 is minimized is a value for calibrating for the gain mismatch $\Delta A_1$ of the poly-phase filter 130.

In the present embodiment of the invention, by adjusting the gain calibration factor ($\Delta A_2$) in the mixer unit 520 with respect to the estimation result of the mismatch estimation unit 550, the entire gain mismatch of the DCR is minimized or removed. Thus, by regarding the gain mismatch ($\Delta A_1$) occurring in the poly-phase filter 130 as a fixed value, and by varying the gain calibration factor $\Delta A_2$ of the mixer unit 520, a value for $\Delta A_2$ is estimated at which the entire gain mismatch of the DCR is minimized.

Alternatively, in other embodiments of the invention, it is also possible to fix the gain mismatch ($\Delta A_2$) occurring in the mixer unit 520 and vary the gain mismatch $\Delta A_1$ of the poly-phase filter 130 such that the entire gain mismatch of the DCR is minimized.

The structure of the DCR shown in FIG. 5 is provided for estimating and calibrating for the entire gain mismatch and phase mismatch of the DCR. After estimating and calibrating for the gain mismatch and phase mismatch by using the DCR structure shown in FIG. 5, minimally distorted baseband signals (I_PATH, Q_PATH) that have been directly converted into baseband signals from the RF signal may be obtained through the simplified (and calibrated) DCR structure shown in FIG. 6.

Figure 6:
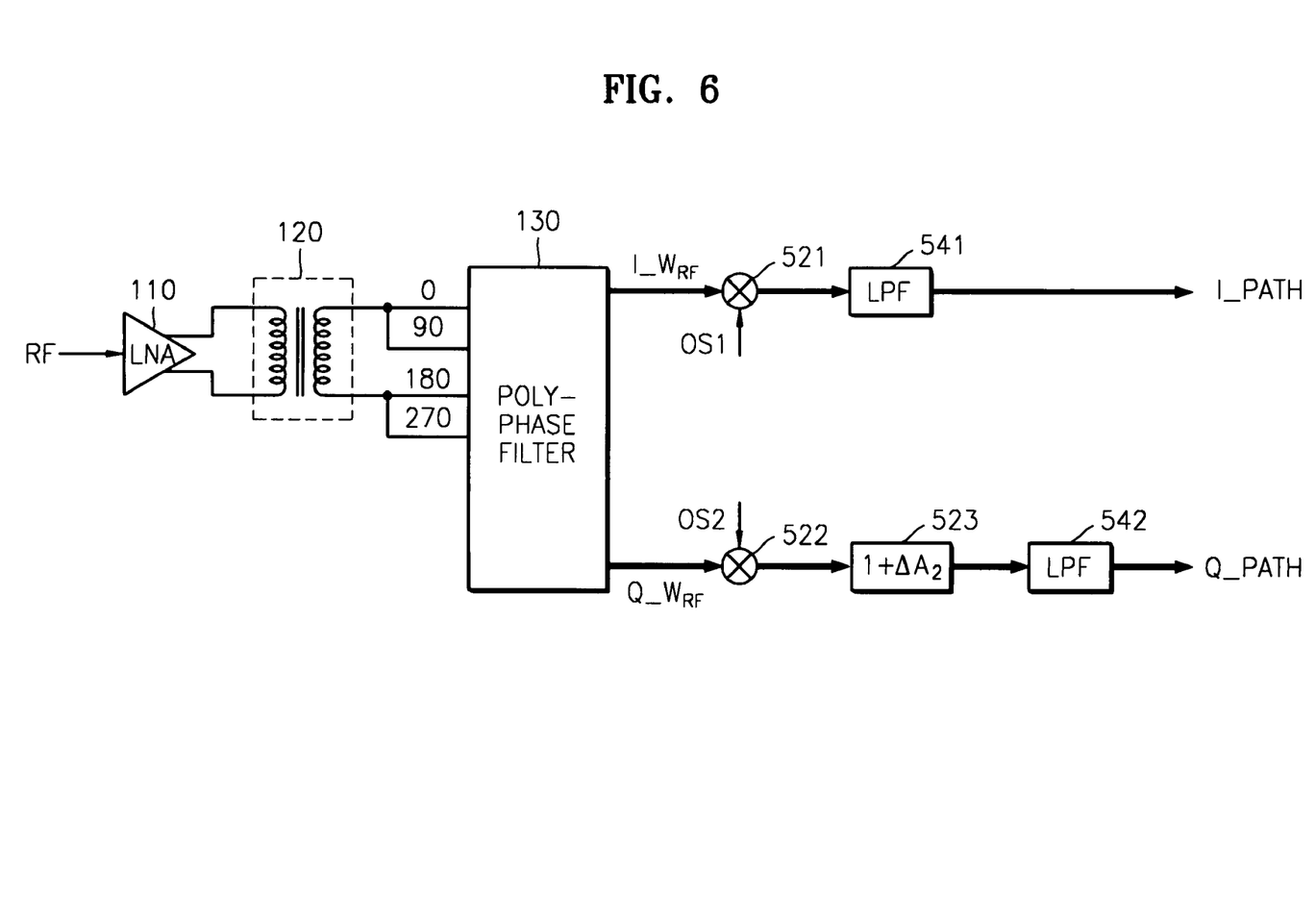
FIG. 6 is a block diagram of the structure of a DCR, according to another preferred embodiment of the present invention, when an RF signal is received.

The DCR of FIG. 6, does not include the mismatch estimation unit 550, the adder 511, and the subtracter 512, that were provided in the DCR of FIG. 5 used for estimating and calibrating for the phase/gain mismatch of the poly-phase filter 130. Here, the second local oscillation signal (OS2) has the same oscillation frequency as that of the first local oscillation signal (OS1). The phase difference between the first and second local oscillation signals (OS1, OS2) is set to 90 degrees plus $\phi_{e2}$ (e.g., where $\phi_{e2}$ is the predetermined value of the calibration factor determined appropriate for the particular poly-phase filter 130 in accordance with the methods of the present invention) to calibrate for the phase mismatch ($\phi_{e1}$) in signals from the poly-phase filter 130. Here, $\phi_{e2}$ may be a fixed or a variable value. Similarly, the gain mismatch ($\Delta A_2$) may be a fixed or a variable value to calibrate for the gain mismatch ($\Delta A_1$) in the poly-phase filter 130 (as may be predetermined for the particular poly-phase filter 130 in accordance with the methods of the present invention). Accordingly, the circuits (e.g., gain adjusters and phase-shifters) for implementing calibration values $\phi_{e2}$ and $\Delta A_2$ respectively may be fixed or variable gain/phase circuits.

Accordingly, the in-phase differential signal (I_$W_{RF}$) output from the poly-phase filter 130 is output as the I-path signal (I_PATH) through the first mixer 521 and the first low pass filter 541. The quadrature-phase differential signal (Q_$W_{RF}$) output from the poly-phase filter 130 is output as the Q-path signal (Q_PATH) through the second mixer 522, the variable gain adjuster 523, and the second low pass filter 542.

According to the present invention, the phase mismatch and gain mismatch of a DCR is removed or minimized. Accordingly, distortion of the radio frequency signal (RF) that is directly converted by the DCR of the present invention is minimized.

Exemplary embodiments of the inventive method and apparatus have been described and explained above. However, the present invention is not limited to the preferred embodiments described above, and it is apparent that variations and modifications by those skilled in the art can be effected within the spirit and scope of the present invention defined in the appended claims. Therefore, the scope of the present invention is not determined by the above description but by the accompanying claims.

What is claimed is:

1. A direct conversion receiver comprising:
a poly-phase filter that generates an in-phase differential signal and a quadrature-phase differential signal derived from a received radio frequency (RF) signal;
an in-phase mixer which mixes the in-phase differential signal with a first local oscillation signal and a second local oscillation signal;
a quadrature-phase mixer which mixes the quadrature-phase differential signal with the first local oscillation signal and a third local oscillation signal; and
a mismatch estimation unit configured to estimate the phase mismatch caused by the poly-phase filter and/or by the in-phase mixer and the quadrature-phase mixer, from output signals of the in-phase mixer and the of quadrature-phase mixer; and
at least one variable phase shifter for adjusting the phase mismatch in response to an output signal of the mismatch estimation unit.

2. The direct conversion receiver of claim 1, wherein the phase mismatch of the in-phase mixer and the quadrature-phase mixer dynamically varies in response to the output signal of the mismatch estimation unit.

3. A direct conversion receiver comprising:
an in-phase mixer including a first mixer which mixes an in-phase differential signal with a first local oscillation signal, and a second mixer which mixes the in-phase differential signal with a second local oscillation signal; and
a quadrature-phase mixer including a third mixer which mixes a quadrature-phase differential signal with the first local oscillation signal, and a fourth mixer which mixes the quadrature-phase differential signal with a third local oscillation signal, and wherein
the second local oscillation signal and the first local oscillation signal have a phase difference of 90° plus a first variable phase calibration factor controlled in response to an output of a mismatch estimation unit; and
the third local oscillation signal and the first local oscillation signal have a phase difference of 90° plus a second variable phase calibration factor controlled in response to an output of the mismatch estimation unit.

4. The direct conversion receiver of claim 3, wherein the first variable phase calibration factor and the second variable phase calibration factor have opposite signs and the same absolute value.

5. The direct conversion receiver of claim 3, wherein the in-phase mixer further comprises a 90° phase shifter that phase shifts the first local oscillation signal and outputs a signal, and a first variable phase shifter that generates the second local oscillation signal by shifting the output signal of the 90° phase shifter by the first variable phase calibration factor; and
the quadrature-phase mixer further comprises a second variable phase shifter that generates the third local oscillation signal by shifting the output signal of the 90° phase shifter by the second variable phase calibration factor.

6. The direct conversion receiver of claim 3, further comprising:
a subtracter that subtracts an output signal of the fourth mixer from an output signal of the first mixer and generates an I-path signal;
an adder that adds an output signal of the second mixer and an output signal of the third mixer and generates a Q-path signal; and
wherein the mismatch estimation unit generates a mismatch signal that is a result of adding a signal obtained by squaring the I-path signal and a signal obtained by squaring the Q-path signal.

7. The direct conversion receiver of claim 2, wherein the mismatch estimation unit comprises:
a first square unit which squares the I-path signal;
a second square unit which squares the Q-path signal; and
an adder that adds the output signals of the first and second square units.

8. The direct conversion receiver of claim 3, further comprising the mismatch estimation unit, wherein at least one of the first variable phase calibration factor and the second variable phase calibration factor varies in response to the signal output from the mismatch estimation unit.

9. A direct conversion receiver (DCR) comprising:
a poly-phase filter that generates an in-phase differential signal and a quadrature-phase differential signal derived from a received radio frequency (RF) signal;

an in-phase mixer that mixes the in-phase differential signal with a first local oscillation signal and a second local oscillation signal;

a quadrature-phase mixer that mixes the quadrature-phase differential signal with the first local oscillation signal and the second oscillation signal; and a variable gain adjuster for adjusting a gain mismatch introduced by the poly-phase filter and the gain mismatch introduced by the in-phase mixer and the quadrature-phase mixer, in response to an output signal of a mismatch estimation unit that estimates the gain mismatch, from the output signals of the in-phase mixer and of the quadrature-phase mixer.

10. The direct conversion receiver of claim 9, further comprising the mismatch estimation unit, wherein the gain mismatch introduced by the in-phase mixer and by introduced by the quadrature-phase mixer varies in response to the output signal of the mismatch estimation unit.

11. The direct conversion receiver of claim 9, wherein
the in-phase mixer comprises a first mixer that mixes the in-phase differential signal with the first local oscillation signal, and a second mixer that mixes the in-phase differential signal with the second local oscillation signal, the second local oscillation signal and the first local oscillation signal having a phase difference of approximately 90°; and the quadrature-phase mixer comprises a third mixer, that mixes the quadrature-phase differential signal with the first local oscillation signal, and a fourth mixer, that mixes the quadrature-phase differential signal with the second local oscillation signal.

12. The direct conversion receiver of claim 11, wherein the in-phase mixer further comprises the variable gain adjuster configured to adjust the gain of input signals or of output signals of the first mixer and the second mixer.

13. The direct conversion receiver of claim 11, wherein the quadrature-phase mixer further comprises the variable gain adjuster configured to adjust the gain of input signals or of output signals of the third mixer and the fourth mixer.

14. The direct conversion receiver of claim 13, further comprising:

a subtracter that subtracts an output signal of the fourth mixer from an output signal of the first mixer, and generates an I-path signal;

an adder that adds an output signal of the second mixer and an output signal of the third mixer, and generates a Q-path signal; and wherein the mismatch estimation unit outputs a signal that is a result of adding a signal obtained by squaring the I-path signal and a signal obtained by squaring the Q-path signal.

15. The direct conversion receiver of claim 9, wherein the gain mismatch of the poly-phase filter has been calibrated for in response to an output signal of the mismatch estimation unit.

16. A direct conversion receiver (DCR) comprising:

a poly-phase filter that generates an in-phase differential signal and a quadrature-phase differential signal derived from a received radio frequency (RF) signal;

a differential signal adder that adds the in-phase differential signal and the quadrature-phase differential signal, and generates an added differential signal;

a differential signal subtracter that subtracts the quadrature-phase differential signal from the in-phase differential signal, and generates a subtracted differential signal;

a mixer unit that mixes the added differential signal with a first local oscillation signal and mixes the subtracted differential signal with a second local oscillation signal; and at least one variable phase shifter for calibrating for the phase mismatch, introduced by the poly-phase filter and the phase mismatch introduced by the mixer units, in response to an output signal of the mismatch estimation unit that estimates the phase mismatch from signals output from the mixer unit.

17. The direct conversion receiver of claim 16, wherein the mixer unit comprises:

a first mixer that mixes the added differential signal with the first local oscillation signal; and a second mixer that mixes the subtracted differential signal with the second local oscillation signal.

18. The direct conversion receiver of claim 17, wherein the phase of the second local oscillation signal and the first local oscillation signal have a phase difference of 90° plus a variable phase correction factor.

19. The direct conversion receiver of claim 17, wherein the phase of the second local oscillation signal and the first local oscillation signal have a phase difference of 90°, and the phase mismatch of the poly-phase filter is calibrated for based on the output signal of the mismatch estimation unit.

20. The direct conversion receiver of claim 18, further comprising the mismatch estimation unit, wherein the mismatch estimation unit comprises:

a first adder that adds the output signal of the first mixer and an output signal of the second mixer;

a third mixer that mixes a signal output by the first adder with a third local oscillation signal;

a fourth mixer that mixes a signal output by the first adder, with a fourth local oscillation signal;

first and second square units which square output signals of the third mixer and the fourth mixer, respectively; and a second adder that adds output signals of the first and second square units.

21. The direct conversion receiver of claim 18, further comprising the mismatch estimation unit, wherein the mismatch estimation unit comprises:

a phase shifter that generates a first output signal and a second output signal having a phase difference of 90°, from a signal obtained by adding output signals of the first mixer and the second mixer;

first and second square units which square the first output signal and the second output signal, respectively; and an adder that adds output signals of the first and second square units.

22. A direct conversion receiver (DCR) comprising:

a poly-phase filter that generates an in-phase differential signal and a quadrature-phase differential signal derived from a received radio frequency (RF) signal;

a differential signal adder that generates an added differential signal by adding the in-phase differential signal and the quadrature-phase differential signal;

a differential signal subtracter that generates a subtracted differential signal by subtracting the quadrature-phase differential signal from the in-phase differential signal;

a mixer unit that mixes the added differential signal with a first local oscillation signal and mixes the subtracted differential signal with a second local oscillation signal; and a variable gain adjuster for adjusting the gain mismatch of at least one of the poly-phase filter and the mixer unit in response to an output signal of a mismatch estimation unit that estimates the gain mismatch from the output signals of the mixer unit.

23. The direct conversion receiver of claim 22, wherein the mixer unit comprises:
    a first mixer which mixes the added differential signal with the first local oscillation signal; and
    a second mixer which mixes the subtracted differential signal with the second local oscillation signal.

24. The direct conversion receiver of claim 23, wherein the
    a variable gain adjuster is configured to adjust the gain of a signal output from the first mixer relative to the gain of a signal output from the second mixer.

25. The direct conversion receiver of claim 23, further comprising the mismatch estimation unit, wherein the gain mismatch of the poly-phase filter is dynamically calibrated in response to the output signal of the mismatch estimation unit.

26. The direct conversion receiver of claim 23, further comprising the mismatch estimation unit, wherein the mismatch estimation unit comprises:
    a third mixer which mixes a signal obtained by adding an output signal of the first mixer and an output signal of the second mixer, with a third local oscillation signal;
    a fourth mixer which mixes a signal obtained by adding the output signal of the first mixer and the output signal of the second mixer, with a fourth local oscillation signal;
    square units which square output signals of the third mixer and the fourth mixer, respectively; and
    an adder that adds output signals of the square units.

27. The direct conversion receiver of claim 23 further comprising the mismatch estimation unit, wherein the mismatch estimation unit comprises:
    a phase-shifting signal splitter that generates a first output signal and a second output signal having a phase difference of 90°, derived from a signal obtained by adding output signals of the first mixer and the second mixer;
    square units which square the first output signal and the second output signal, respectively; and
    an adder that adds output signals of the square units, wherein the gain of the variable gain adjuster or the gain mismatch of the poly-phase filter varies so that the value obtained by low pass filtering the output of the mismatch estimation unit adder is minimized.

28. An apparatus comprising:
    a poly-phase filter that generates an in-phase differential signal and a quadrature-phase differential signal, having a phase mismatch and/or a gain mismatch;
    an first mixer which mixes the in-phase differential signal with a first local oscillation signal,
    a second mixer which mixes the quadrature-phase differential signal with a second local oscillation signal; comprising:
    a phase shifter, that phase shifts the first local oscillation signal by 90° plus the value of a variable phase calibration factor that calibrates for the phase mismatch of the poly-phase filter, and outputs the result as the second local oscillation signal; and
    a variable gain adjuster for adjusting the gain of the signal output from at least one of the first mixer and the second mixer for calibrating for the gain mismatch of the poly-phase filter.

29. The apparatus of claim 23 further comprising a mismatch estimation unit including:
    a third mixer which mixes a signal obtained by adding an output signal of the first mixer and an output signal of the second mixer, with a third local oscillation signal;
    a fourth mixer which mixes a signal obtained by adding the output signal of the first mixer and the output signal of the second mixer, with a fourth local oscillation signal;
    square units which square output signals of the third mixer and the fourth mixer, respectively; and
    an adder that adds output signals of the square units.

* * * * *